United States Patent
Moon

(10) Patent No.: US 12,243,847 B2
(45) Date of Patent: Mar. 4, 2025

(54) BONDING APPARATUS AND BONDING METHOD

(71) Applicant: SEMES CO., LTD., Cheonan-si (KR)

(72) Inventor: Gil Yong Moon, Daejeon (KR)

(73) Assignee: SEMES CO., LTD., Cheonan-si (KR)

( * ) Notice: Subject to any disclaimer, the term of this patent is extended or adjusted under 35 U.S.C. 154(b) by 617 days.

(21) Appl. No.: 17/384,750

(22) Filed: Jul. 24, 2021

(65) Prior Publication Data

US 2022/0045029 A1 Feb. 10, 2022

(30) Foreign Application Priority Data

Aug. 10, 2020 (KR) .......................... 10-2020-0099711

(51) Int. Cl.
*H01L 23/00* (2006.01)
*H01L 21/67* (2006.01)

(52) U.S. Cl.
CPC ...... *H01L 24/741* (2013.01); *H01L 21/67248* (2013.01); *H01L 24/95* (2013.01)

(58) Field of Classification Search
CPC ....... H01L 24/741; H01L 24/95; H01L 24/75; H01L 24/80; H01L 21/67248; H01L 21/67144; H01L 21/52; H01L 21/67253; H01L 21/681; H01L 2224/75101; H01L 2224/75252; H01L 2224/759; H01L 2224/75901; H01L 2224/80095; H01L 2224/80801; H01L 2224/828; H01L 2224/818; H01L 23/488; B23K 31/02; B23K 37/00; B23K 37/0252
See application file for complete search history.

(56) References Cited

U.S. PATENT DOCUMENTS 9,478,516 B2 * 10/2016 Wasserman ............. H01L 24/75
2011/0114708 A1 5/2011 Maeda et al.
2014/0175159 A1 6/2014 Kostner

FOREIGN PATENT DOCUMENTS

TW 201533817 9/2015

OTHER PUBLICATIONS

Applied Motion Products Incorporated, "XYZ Gantry Demo" Uploaded to YouTube on Oct. 25, 2018. Available at <https://www.youtube.com/watch?v=4YZWsLwE0s4> (Year: 2018).*

* cited by examiner

*Primary Examiner* — Alex B Efta
*Assistant Examiner* — Alexander S Wright

(57) ABSTRACT

A bonding apparatus includes a stage on which a substrate is seated, a gantry installed above the stage, a bonding unit for bonding a chip to the substrate while moving along the gantry, a first temperature sensor installed on the bonding unit and providing a first temperature value of the bonding unit, a second temperature sensor installed at a periphery of the bonding apparatus and providing a second temperature value of an atmospheric temperature at the periphery of the bonding apparatus, and a control part causing the bonding unit to be aligned with a bonding position on the substrate, controlling the bonding unit to allow the bonding unit to bond the chip at the bonding position, and determining a movement distance of the bonding unit based on a weighted sum of the first temperature value and the second temperature value.

13 Claims, 5 Drawing Sheets

BONDING APPARATUS AND BONDING METHOD

CROSS-REFERENCE TO RELATED APPLICATIONS

This application claims the priority of Korean Patent Application No. 10-2020-0099711 filed on Aug. 10, 2020, in the Korean Intellectual Property Office, the disclosure of which is incorporated herein by reference.

BACKGROUND

Field

The present disclosure relates to a bonding apparatus and a bonding method which are configured to bond a chip to a substrate, and more particularly, to a bonding apparatus and a bonding method that determine and correct a bonding position based on data detected by a temperature sensor.

Description of the Related Art

A process of manufacturing a semiconductor (or a display) refers to a process of manufacturing a semiconductor element on a substrate (e.g., a wafer) and includes exposure, deposition, etching, ion-doping, cleaning, packaging, and the like, for example. In particular, a TSV (through silicon via) technology has been introduced as a technology that is a substitute for a wire-bonding process of electrically connecting stacked chips during the packaging process. The TSV bonding electrically connects a lower chip and an upper chip by forming fine holes in the chips and inserting an electric conductor into the holes.

A chip bonding process of bonding a chip to a substrate may be performed as one step of the TSV bonding process. In general, a bonding head of a bonding unit picks up a chip, moves to a bonding position on a substrate, and then bonds the chip at the bonding position. In this case, a vision unit (e.g., a camera) provided on the bonding unit is used to check whether the bonding head is aligned with the bonding position, the position of the bonding head is corrected by using the vision unit, and then the bonding is performed.

Meanwhile, there is a need for a method of quickly bonding a chip to a substrate to improve the efficiency of a semiconductor manufacturing process. However, a bonding time may be delayed due to a procedure such as the correction procedure using the vision unit, as described above.

SUMMARY

Therefore, the present disclosure has been made in an effort to provide a bonding apparatus and a bonding method which are configured to accurately and quickly bond a chip to a substrate.

The object of the present disclosure is not limited to the above-mentioned object, and other objects, which are not mentioned above, may be clearly understood by those skilled in the art from the following descriptions.

In one aspect, the present disclosure provides a bonding apparatus including: a stage on which a substrate is seated; a gantry installed above the stage; a bonding unit configured to bond a chip to the substrate while moving along the gantry; a first temperature sensor installed on the bonding unit and configured to provide a first temperature value corresponding to a temperature of the bonding unit; a second temperature sensor installed at a periphery of the bonding apparatus and configured to provide a second temperature value corresponding to an atmospheric temperature at the periphery of the bonding apparatus; and a control part configured to cause the bonding unit to be aligned with a bonding position on the substrate, the control part being configured to control the bonding unit to allow the bonding unit to bond the chip at the bonding position. The control part may determine a movement distance of the bonding unit based on a weighted sum of the first temperature value and the second temperature value.

In the embodiment, the control part may correct a first weight applied to the first temperature value and correct a second weight applied to the second temperature value based on a result of a bonding inspection on the chip on the substrate.

In the embodiment, the gantry may include first and second movement guides that define a route for a horizontal movement of the bonding unit.

In the embodiment, the bonding apparatus may further include a third temperature sensor installed on the first movement guide and configured to provide a third temperature value corresponding to a temperature of the first movement guide, in which the control part determines the movement distance of the bonding unit based on a weighted sum of the first temperature value, the second temperature value, and the third temperature value.

In the embodiment, the control part may correct the first weight, the second weight, and a third weight applied to the third temperature value based on the result of the bonding inspection on the chip on the substrate.

In the embodiment, the bonding apparatus may further include a fourth temperature sensor installed on the second movement guide and configured to provide a fourth temperature value corresponding to a temperature of the second movement guide, in which the control part determines the movement distance of the bonding unit based on a weighted sum of the first temperature value, the second temperature value, the third temperature value, and the fourth temperature value.

In the embodiment, the control part may correct the first weight, the second weight, the third weight, and a fourth weight applied to the fourth temperature value based on the result of the bonding inspection on the chip on the substrate.

In another aspect, the present disclosure provides a bonding method including: positioning a substrate on a stage; checking a bonding position of the substrate; aligning a bonding unit of a bonding apparatus with the bonding position of the substrate; and bonding a chip at the bonding position on the substrate. In this case, the moving of the bonding unit may include: acquiring a first temperature value from a first temperature sensor installed on the bonding unit; acquiring a second temperature value from a second temperature sensor installed at a periphery of the bonding apparatus; and determining a movement distance of the bonding unit based on a weighted sum of the first temperature value and the second temperature value.

In the embodiment, the bonding method may further include correcting a first weight applied to the first temperature value and correcting a second weight applied to the second temperature value based on a result of a bonding inspection on the chip on the substrate.

In the embodiment, the moving of the bonding unit may further include acquiring a third temperature value corresponding to a temperature of a first movement guide from the first temperature sensor installed on the first movement guide that defines a route for a horizontal movement of the bonding unit on a gantry.

In the embodiment, the moving of the bonding unit may include determining the movement distance of the bonding unit based on a weighted sum of the first temperature value, the second temperature value, and the third temperature value.

In the embodiment, the moving of the bonding unit may further include acquiring a fourth temperature value corresponding to a temperature of a second movement guide from a fourth temperature sensor installed on the second movement guide that defines the route for the horizontal movement of the bonding unit on the gantry.

In the embodiment, the moving of the bonding unit may include determining the movement distance of the bonding unit based on a weighted sum of the first temperature value, the second temperature value, the third temperature value, and the fourth temperature value.

In the embodiment, the bonding method may further include correcting the first weight, the second weight, a third weight applied to the third temperature value, and a fourth weight applied to the fourth temperature value based on the result of the bonding inspection on the chip on the substrate.

In still another aspect, the present invention provides a bonding apparatus including: a loading part on which a container for accommodating a substrate is seated; a substrate conveying part configured to convey the substrate from the container seated on the loading part; a bonding part configured to bond a chip to the substrate provided from the substrate conveying part; and an inspection part configured to receive, from the substrate conveying part, the substrate processed by the bonding part and inspect the chips bonded to the processed substrate. The bonding part may include: a stage on which the substrate is seated; a gantry installed above the stage; a bonding unit configured to bond the chip to the substrate while moving along the gantry; a first temperature sensor installed on the bonding unit and configured to provide a first temperature value corresponding to a temperature of the bonding unit; a second temperature sensor installed in the vicinity of the bonding part and configured to provide a second temperature value corresponding to a temperature in the vicinity of the bonding part; and a control part configured to cause the bonding unit to be aligned with a bonding position on the substrate, the control part being configured to control the bonding unit to allow the bonding unit to bond the chip at the bonding position. The control part may determine a movement distance of the bonding unit based on a weighted sum of the first temperature value and the second temperature value.

According to the embodiment of the present disclosure, it is possible to quickly move the bonding unit to an accurate position and quickly bond the chip to the substrate by determining and correcting the movement distance of the bonding unit using temperature data provided from the temperature sensors.

The effect of the present disclosure is not limited to the above-mentioned effect, and other effects, which are not mentioned above, may be clearly understood by those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1:
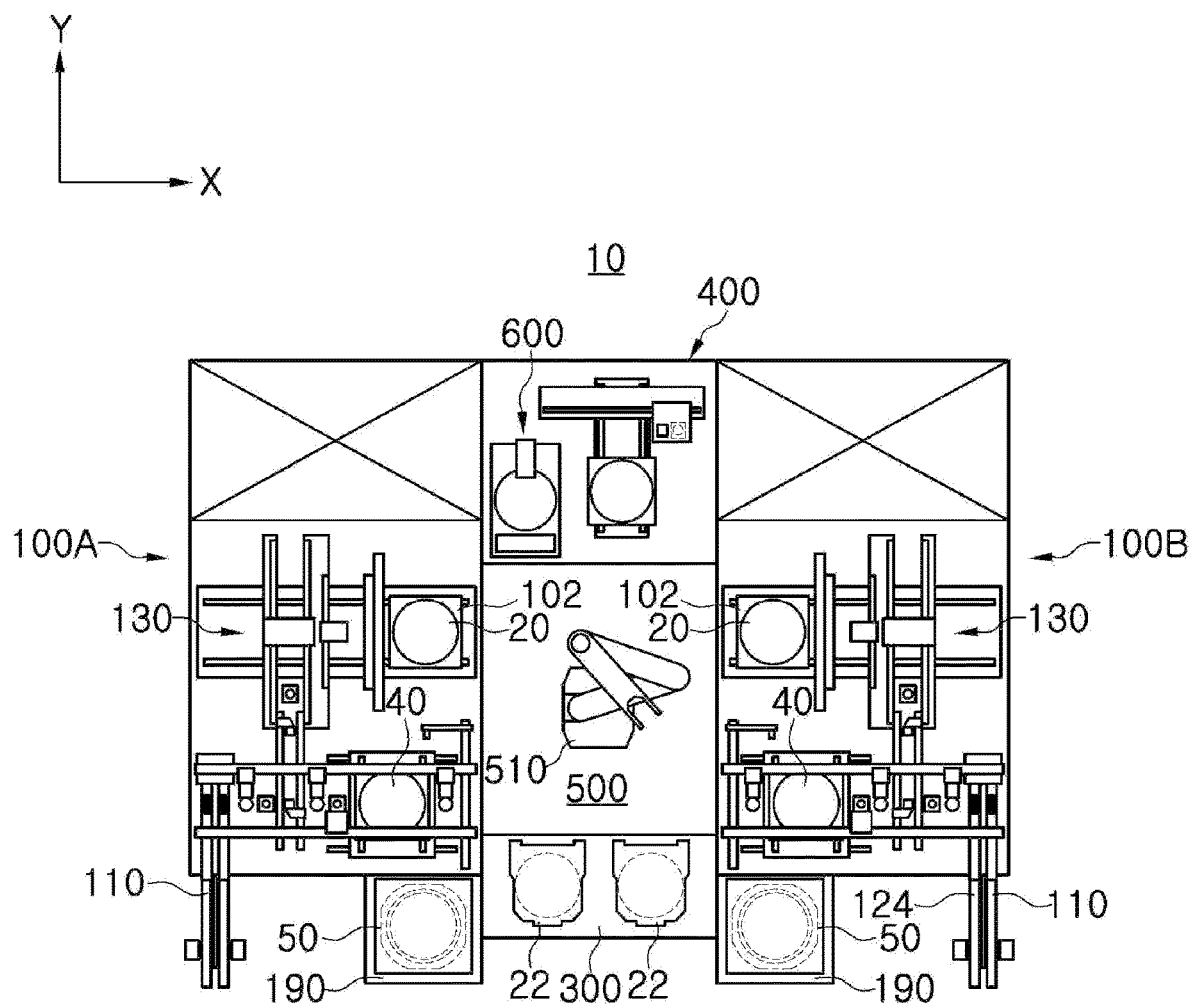
FIG. 1 is a view illustrating a schematic structure of a bonding facility according to an embodiment of the present disclosure.

Hereinafter, embodiments of the present disclosure will be described in detail with reference to the accompanying drawings so that those with ordinary skill in the art to which the present disclosure pertains may easily carry out the embodiments. The present disclosure may be implemented in various different ways and is not limited to the embodiments described herein.

A part irrelevant to the description will be omitted to clearly describe the present disclosure, and the same or similar constituent elements will be designated by the same reference numerals throughout the specification.

In addition, the constituent elements having the same configurations in the several embodiments will be assigned with the same reference numerals and described only in the representative embodiment, and only the constituent elements, which are different from the constituent elements according to the representative embodiment, will be described in other embodiments.

Throughout the specification, when one constituent element is referred to as being "connected to (or coupled to)" another constituent element, one constituent element can be "directly connected to (coupled to)" the other constituent element, and one constituent element can also be "indirectly connected to (coupled to)" the other element with other elements interposed therebetween. In addition, unless explicitly described to the contrary, the word "comprise/include" and variations such as "comprises/includes" or "comprising/including" will be understood to imply the inclusion of stated elements, not the exclusion of any other elements.

Unless otherwise defined, all terms used herein, including technical or scientific terms, have the same meaning as commonly understood by those skilled in the art to which the present disclosure pertains. The terms such as those defined in a commonly used dictionary should be interpreted as having meanings consistent with meanings in the context of related technologies and should not be interpreted as ideal or excessively formal meanings unless explicitly defined in the present application.

FIG. 1 is a view illustrating a schematic structure of a bonding facility (i.e., a bonding apparatus or a bonding equipment) according to an embodiment of the present disclosure. A bonding facility 10 according to the embodiment of the present disclosure may be used to bond a chip 42 to a substrate 20. In this case, the chip 42 may be supplied from a tray or a carrier tape 30 or supplied from a wafer 40.

The bonding facility 10 may include: a loading part 300 on which a container 22 for accommodating the substrate 20 is seated; a substrate conveying part 500 configured to convey the substrate 20 from the container seated on the loading part 300; bonding parts 100A and 100B configured to bond the chips 42 to the substrates 20 provided from the substrate conveying part 500; and an inspection part 400 configured to receive, from the substrate conveying part 500, the substrates 20 to which the chips 42 are bonded by the bonding parts 100A and 100B, and the inspection part 400 inspects the chips 42 bonded to the substrate 20. In addition, the bonding facility 10 may include: carrier tape supply parts 110 and 124 configured to supply carrier tapes to which the chips 42 to be bonded to the substrate 20 are attached; and a chip carrier loading part 190 to which the container 50 for accommodating the wafer 40 with chips 42 is loaded.

For example, the bonding parts may include a first bonding part 100A and a second bonding part 100B. As illustrated in FIG. 1, the first bonding part 100A and the second bonding part 100B may be disposed symmetrically with respect to the substrate conveying part 500. In addition, the loading part 300 and the inspection part 400 may be disposed to face each other with the substrate conveying part 500 interposed therebetween.

Referring to FIG. 1, when the container 22, which accommodates the substrates 20, is seated on the loading part 300, the substrates 20 accommodated in the container 22 are delivered to the bonding parts 100A and 100B by a substrate transport robot 510 of the substrate conveying part 500. In addition, the carrier tape supply parts 110 and 124 and the chip carrier loading part 190 are provided as chip loading parts, and the chips may be supplied to the bonding parts 100A and 100B from the carrier tape supply parts 110 and 124 or the wafers 40 with the chips 42 may be supplied to the bonding parts 100A and 100B from the container 50 seated on the chip carrier loading part 190. Bonding units 130 are provided to bond the chips 42 to the substrates 20 seated on stages 102. A method of operating the bonding unit 130 and a bonding method will be described below.

When the process of bonding the chip 42 to the substrate 20 is completed, the substrates 20 are delivered to the inspection part 400 from the bonding parts 100A and 100B by the substrate transport robot 510 so as to be subjected to a post-bonding inspection (PBI). A substrate alignment unit 600 is provided in the inspection part 400, and the substrate alignment unit 600 may align the substrate 20 with an inspection stage and an inspection device. After the inspection part 400 completes the inspection, the substrate 20 may be accommodated in the container 22 of the loading part 300 by the substrate transport robot 510 and then unloaded to the subsequent processes.

Figure 2:
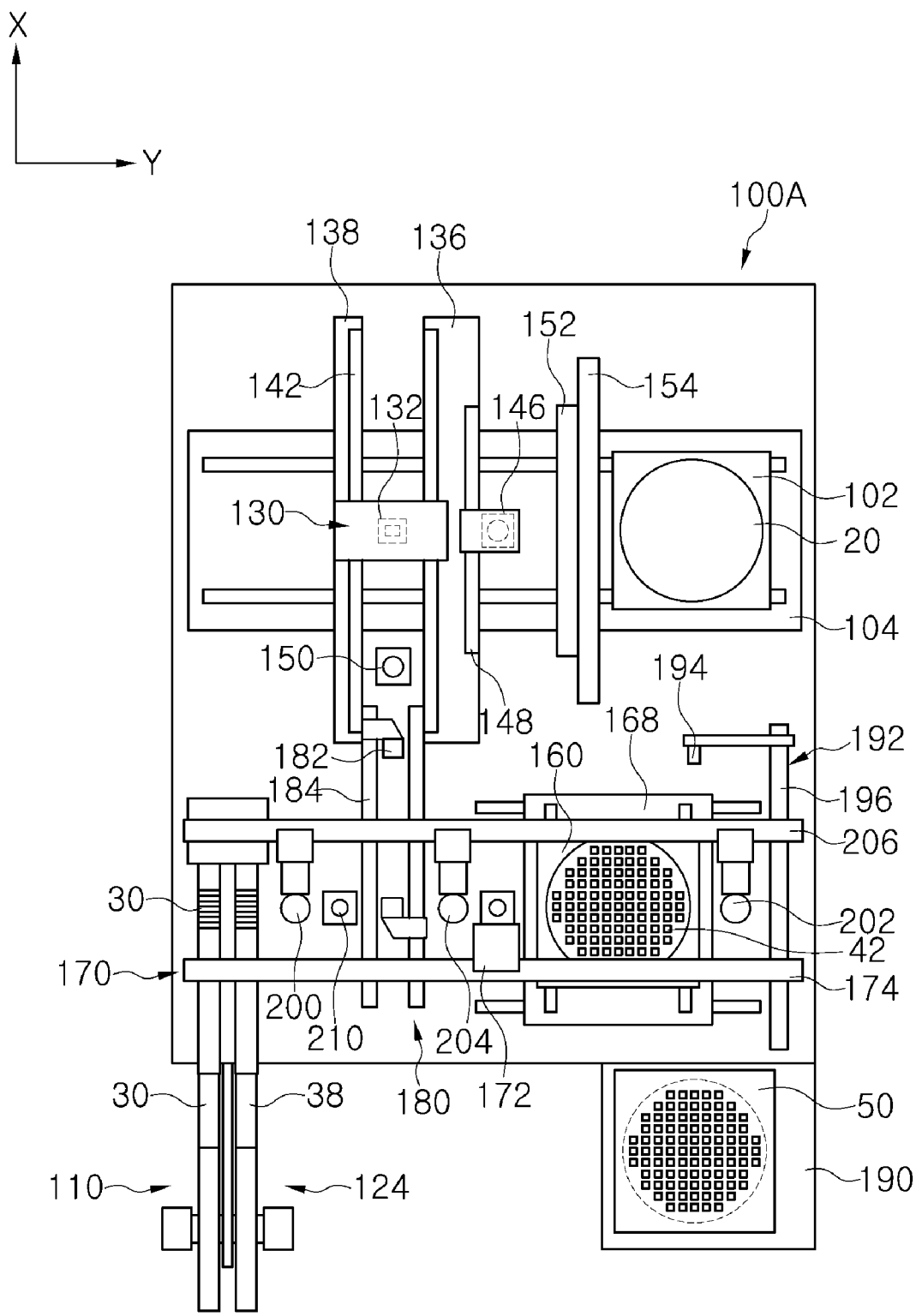
FIG. 2 is a view illustrating a schematic structure of a bonding device in the bonding facility according to the embodiment of the present disclosure.

FIG. 2 is a view illustrating a schematic structure of the bonding part in the bonding facility according to the embodiment of the present disclosure. FIG. 2 illustrates a detailed structure of the first bonding part 100A illustrated in FIG. 1.

Referring to FIG. 2, the first bonding part 100A includes the stage 102 on which the substrate 20 is seated, gantries 136 and 138 (e.g., tracks) installed above the stage 102, and the bonding unit 130 configured to bond the chip 42 to the substrate 20 while moving along the gantries 136 and 138. The gantries 136 and 138 may include a first gantry 136 and a second gantry 138 extending in parallel with each other along a horizontal direction (e.g., X). Although not illustrated, a control part (i.e., a control device) may be provided to control an operation (a horizontal movement and/or a vertical movement) of the bonding unit. According to the embodiment of the present disclosure, a plurality of temperature sensors may be provided to measure temperature values used as variables for controlling the operation of the bonding unit.

The bonding unit 130 may include a bonding head 132 configured to bond the chips 42 to the substrate 20, and a head drive part configured to move the bonding head 132 in horizontal and vertical directions. A bonding tool having a size corresponding to the chips 42 may be mounted on the bonding head 132. The bonding unit 130 may pick up the chips 42 using a vacuum pressure, and a heater (not illustrated) for heating the chips 42 may be provided in the bonding head 132. The stage 102 may be moved in the horizontal direction by a stage drive part 104. For example, the stage 102 may be moved in an X-axis direction by the stage drive part 104, and the bonding head 132 may be moved in a Y-axis direction by the head drive part. That is, the bonding head 132 may be aligned with a bonding position on the substrate 20 by the stage drive part 104 and the head drive part. In addition, the stage 102 may be rotated to align the substrate 20.

An upper alignment camera 146 may be disposed above the stage 102 to detect the bonding positions on the substrate 20. For example, the upper alignment camera 146 may be configured to be moved in the Y-axis direction along the first gantry 136 by an upper alignment camera drive part 148. The upper alignment camera 146 may be used to align the bonding position and the bonding head 132. That is, the upper alignment camera 146 may detect the bonding positions on the substrate 20, and the position of the bonding head 132 may be adjusted based on position coordinates of the detected bonding positions.

A first lower camera 150 may be disposed between the gantries 136 and 138, and the first lower camera 150 may detect a state in which the chip 42 is attached to a lower surface of the bonding tool by a vacuum. The first lower camera 150 may be used to correct a posture of the chip 42 attached to the bonding tool. The gantries 136 and 138 include movement guides 141 and 142 that guide the horizontal movement of the bonding unit 130. The bonding unit 130 may move along the movement guides 141 and 142. Although not illustrated, a control part may be provided to control the bonding operation of the bonding unit 130. The control part may be implemented by one or more processors. As described below, the control part may move the bonding unit 130 to position the bonding unit 130 at the bonding position and control the bonding unit 130 to allow the bonding unit 130 to bond the chip 42 at the bonding position. According to the embodiment of the present disclosure, the control part may use the temperature values provided from the plurality of temperature sensors to compensate for an error in movement amount caused by heat.

In addition, the bonding part may include the first carrier tape supply part 110 configured to supply a first carrier tape 30 having pockets in which the chips 42 to be bonded to the substrate 20 are accommodated, and the second carrier tape supply part 124 configured to supply a second carrier tape 38. In particular, any one of the first carrier tape supply part 110 and the second carrier tape supply part 124 may be selectively used. For example, after all the chips 42 accommodated in the first carrier tape 30 are supplied, the chips 42 accommodated in the second carrier tape 38 may be supplied. In addition, the first carrier tape supply part 110 and the second carrier tape supply part 124 may supply different types of dies, respectively. Unlike the configuration illustrated in FIG. 2, only the single carrier tape supply part 110 or 124 may be provided.

In addition, the wafer 40 on which the chips 42 are positioned may be provided as a means for supplying the chips 42. The wafer 40 may be seated on a wafer stage 160. The chip carrier loading part 190 may be provided at one side of the wafer stage 160 to support the container 50 that accommodates wafers 40 with chips 42. In addition, a wafer conveying part 192 may be provided at one side of the chip carrier loading part 190 to withdraw the wafer 40 from the container 50 and convey the wafer 40 onto the wafer stage 160. The wafer conveying part 192 may include a gripper 194 configured to hold the wafer 40, and a gripper drive part 196 configured to move the gripper 194 in the horizontal direction.

A first chip conveying unit 170 may be disposed above the carrier tape supply parts 110 and 124 and the wafer stage 160 to pick up and convey the chips 42, one by one, from the carrier tapes 30 and 38 or the wafer 40. The first chip conveying unit 170 may include a picker 172 disposed above the carrier tape supply parts 110 and 124 and the wafer stage 160 and configured to pick up the chips 42 using a vacuum pressure, and a picker drive part 174 configured to move the picker 172 in the horizontal direction (e.g., the X-axis direction). In addition, the picker drive part 174 may move the picker 172 in the vertical direction to pick up the chip 42.

A second chip conveying unit 180 may be disposed between the wafer stage 160 and the carrier tape supply parts 110 and 124 to move the chip 42, which is conveyed by the picker 172, to a position adjacent to the stage 102. The second chip conveying unit 180 may include a chip shuttle 182 configured to support the chip 42, and a shuttle drive part 184 configured to move the chip shuttle 182 in the horizontal direction, for example, the Y-axis direction between a first position between the wafer stage 160 and the carrier tape supply parts 110 and 124 and a second position adjacent to the stage 102.

A first upper camera 200 may be disposed above the carrier tape supply parts 110 and 124 to detect the position of the chip 42, and a second upper camera 202 may be disposed above the wafer stage 160 to detect the position of the chip to be picked up among the chips 42 on the wafer 40. Further, a third upper camera 204 may be disposed above the second chip conveying unit 180 to inspect the chip 42 positioned on the chip shuttle 182.

The first, second, and third upper cameras 200, 202, and 204 may be moved in the horizontal direction, for example, the X-axis direction by a second camera drive part 206. In addition, a second lower camera 210 may be disposed below the first chip conveying unit 170 to detect the chip 42 picked up by the picker 172. The second lower camera 210 may be used to correct a posture of the chip 42 picked up by the picker 172.

Hereinafter, a method of determining and correcting a bonding position according to the embodiment of the present disclosure will be described. In the case of a general method of aligning the bonding head 132 using visual data, the upper alignment camera 146 is used to recognize a pattern on the substrate 20, and then the bonding unit 130 is moved to bond the chip 42 to the substrate 20. In order to stack the chips in multiple layers, the chip positioned on the substrate 20 is recognized, and then another chip is bonded to an upper portion of the chip. In the case of the general alignment method using the visual data, a calibration method of determining a bonding position is set in accordance with average data of values of errors in bonding position. In this case, there is a problem in that an error caused by heat generated by the consistent bonding process is not considered.

According to the embodiment of the present disclosure, the temperature sensors are disposed at the appropriate positions in the bonding apparatus, and a drive value of the bonding unit 130 for the bonding process is corrected based on the temperature values measured by the temperature sensors. More specifically, the bonding process may be performed by estimating a correlation between the temperature value and the value of error in bonding position derived from an inspection result (PBI) performed after the chips 42 are bonded to the substrate 20, and then by correcting the drive value of the bonding unit 130 in consideration of the temperature value measured in the bonding process. More specifically, the present disclosure provides a method of determining and correcting a movement amount (e.g., a movement distance) of the bonding unit 130 by using a linear regression model implemented from the correlation between the temperature value and the bonding error derived from the result of the bonding inspection. Hereinafter, an example of correcting the movement distance of the bonding unit 130 moving along the movement guides 141 and 142 of the gantries 136 and 138 will be described with reference to FIGS. 3 and 4. The present disclosure may of course be applied to a two-dimensional motion and a three-dimensional motion as well as the one-dimensional motion illustrated in FIGS. 3 and 4.

Figure 3:
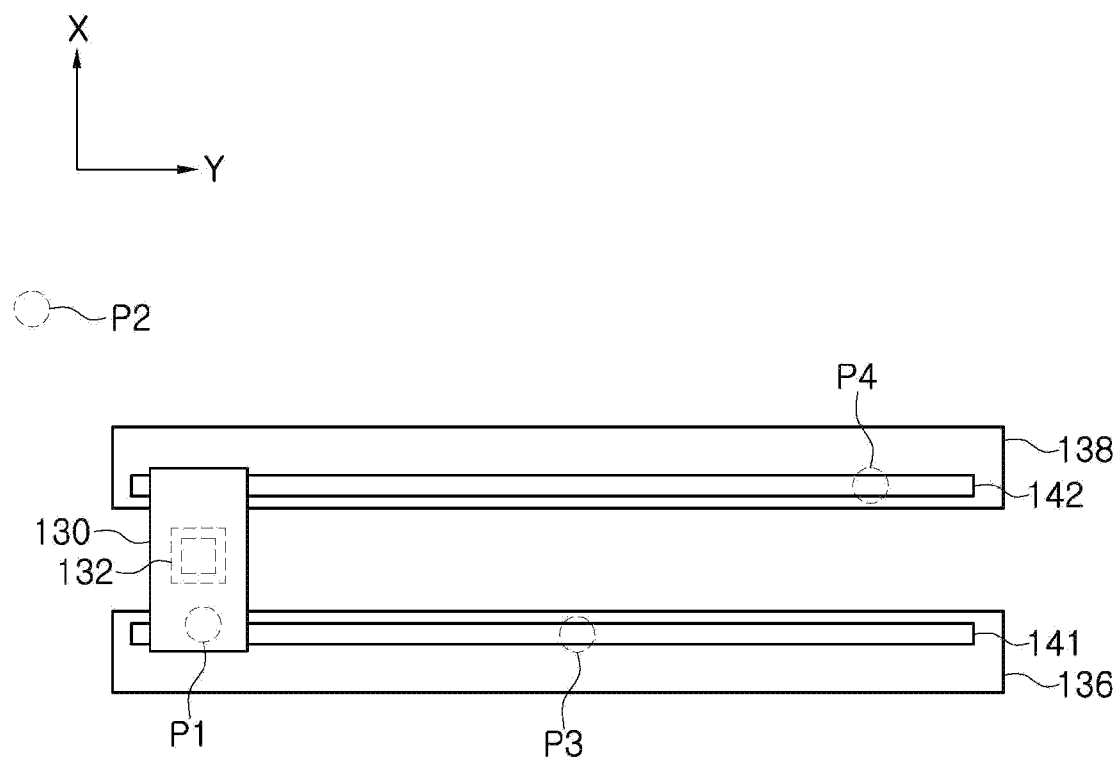
FIGS. 3 and 4 are views illustrating a bonding apparatus according to the embodiment of the present disclosure and illustrating an example in which temperature sensors are disposed in the bonding apparatus.
Figure 4:
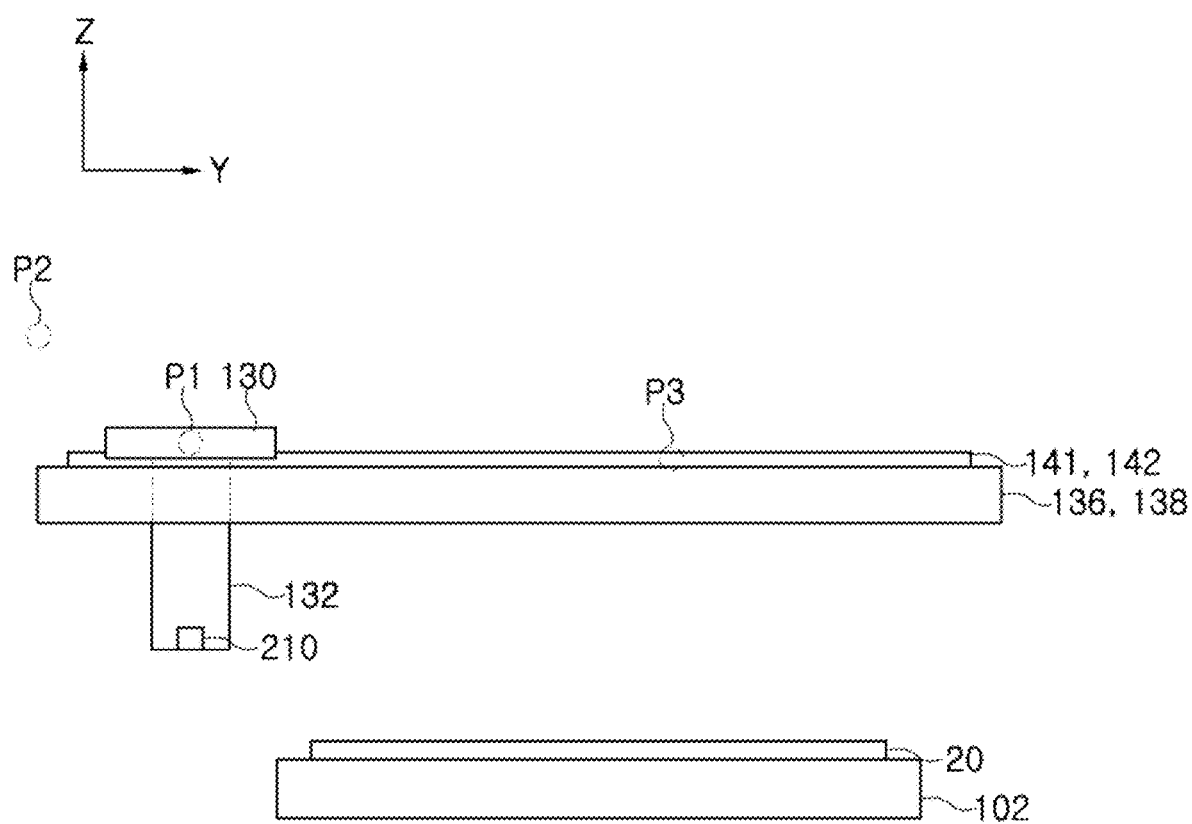

FIGS. 3 and 4 are views illustrating the bonding apparatus according to the embodiment of the present disclosure and illustrating an example in which the temperature sensors are disposed in the bonding apparatus. FIG. 3 illustrates the bonding apparatus when viewed from the lateral side, and FIG. 4 illustrates the bonding apparatus when viewed from the top side.

Referring to FIGS. 3 and 4, the gantries 136 and 138 are installed above the stage 102, and the movement guides 141 and 142 are provided as components of the gantries 136 and 138 to move the bonding unit 130 in the horizontal direction. The bonding unit 130 may move to the bonding position along the movement guides 141 and 142 and then bond the chips 42 to the substrate 20. There may occur an error in movement distance to the bonding position due to heat generated by friction or the like generated when the bonding unit 130 moves along the movement guides 141 and 142.

According to the embodiment of the present disclosure, it is possible to correct the movement amount for the bonding process by using the two or more temperature sensors and a linear regression equation using a regression analysis model. In this case, the temperature sensors may be installed at positions P1, P2, P3, and P4 in the decreasing order of importance of the temperature sensors affecting the movement of the bonding unit 130. According to the embodiment of the present disclosure, the two temperature sensors may be used. In this case, a first temperature sensor may be installed at a position P1 on a part of the bonding unit 130, and a second temperature sensor may be installed at a position P2 at the periphery of the bonding apparatus to measure a temperature of air at the periphery of the bonding apparatus.

As another embodiment, an additional temperature sensor may be disposed to implement high-precision compensation. For example, a third temperature sensor may be disposed at a position P3 on a part of the first movement guide 141 along which the bonding unit 130 moves. In addition, a fourth temperature sensor may be disposed at a position P4 on a part of the second movement guide 142. The position P3 at which the third temperature sensor is disposed and the position P4 at which the fourth temperature sensor is disposed may be disposed in a diagonal direction so as not to overlap each other when viewed from the lateral side. Therefore, more various variables may be applied to the linear regression equation.

In other words, the gantry may include the first and second movement guides 141 and 142 that define a route for the horizontal movement of the bonding unit 130. In this case, a temperature value (a third temperature value) of the first movement guide 141, which is provided from the third temperature sensor installed on the first movement guide 141, may be applied to the linear regression equation together with a first temperature value and a second temperature value. Likewise, based on a result of a bonding inspection, a third weight applied to the third temperature value may be corrected together with a first weight and a second weight. In addition, a temperature value (a fourth temperature value) of the second movement guide 142, which is provided from the fourth temperature sensor installed on the second movement guide 142, may be applied to the linear regression equation together with the first temperature value, the second temperature value, and the third temperature value. Likewise, based on the result of the bonding inspection, a fourth weight applied to the fourth temperature value may be corrected together with the first weight, the second weight, and the third weight.

With the use of the linear regression equation in which the temperature values measured by the temperature sensors are used as variables, it is possible to improve the bonding precision and quickly perform the bonding process by correcting the movement amount for the bonding process in consideration of the error caused by thermal deformation. For example, when a degree of correction to the movement distance is y in the linear regression equation like the following Equation 1, $x_1, x_2, \ldots, x_n$ represent the temperature values, and $\beta_1, \beta_2, \ldots, \beta_n$ represent the weights applied to the temperature values of the respective sensors. $\beta_0$ represents an offset value which is a value set in advance or set by applying previous bonding errors or the like.

$$y = \beta_0 + \beta_1 x_1 + \beta_2 x_2 + \ldots + \beta_n x_n \quad \text{[Equation 1]}$$

That is, the control part configured to control the operation of the bonding unit 130 may determine the movement distance of the bonding unit 130 based on the linear regression equation to which a weighted sum of the temperature values measured by the temperature sensors are applied. The respective weights may be changed in consideration of the bonding errors detected during the post-bonding inspection. Various machine learning algorithms (e.g., least-square approximation, maximum likelihood (ML) estimation, or random sample consensus (RANSAC)) may be applied as the method of correcting the weight of the linear regression equation.

In the embodiment of the present disclosure, the control part may determine the movement amount of the bonding unit 130 based on a weighted sum of the temperature value (the first temperature value) of the bonding unit 130 provided from the first temperature sensor installed on the bonding unit 130 and the temperature value (the second temperature value) at the periphery of the bonding unit 130 provided from the second temperature sensor installed at the periphery of the bonding unit 130.

In addition, based on the result of the bonding inspection on the chips 42 on the substrate 20, the control part may correct the first weight applied to the first temperature value and correct the second weight applied to the second temperature value.

Figure 5:
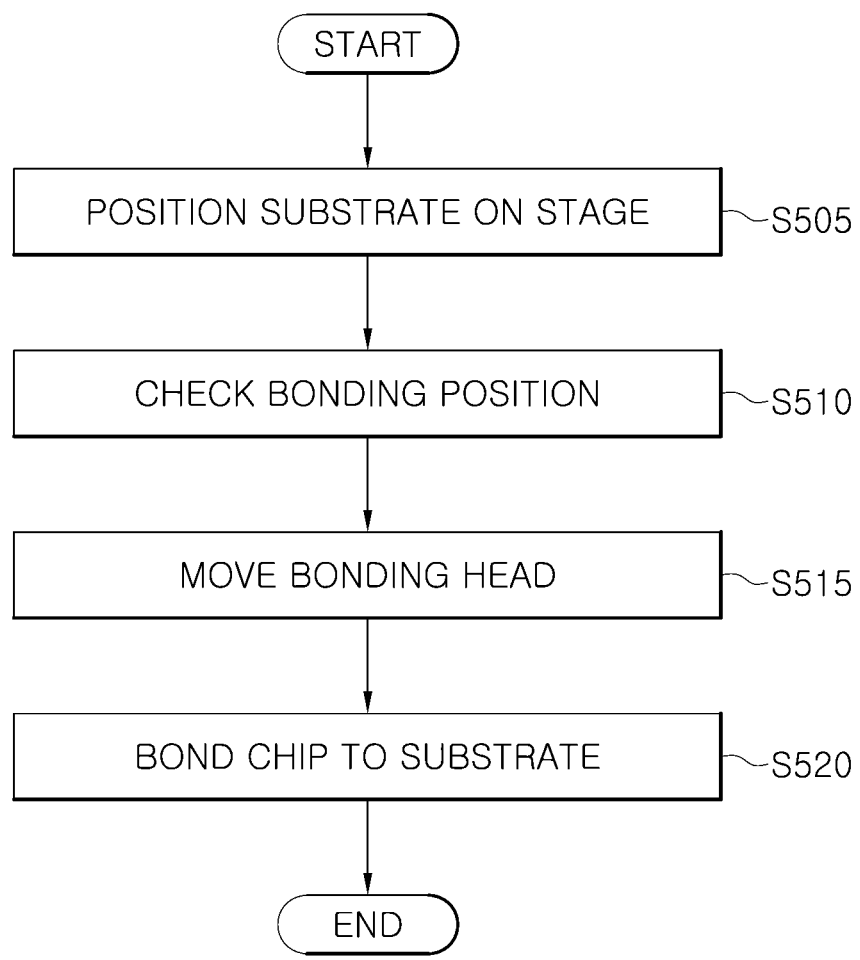
FIG. 5 is a flowchart illustrating a bonding method according to the embodiment of the present disclosure.

FIG. 5 is a flowchart illustrating a bonding method according to the embodiment of the present disclosure. The operations illustrated in FIG. 5 may be performed by the control part (processor).

The bonding method according to the embodiment of the present disclosure may include positioning the substrate 20 on the stage 102 (S505), checking a bonding position on the substrate 20 (S510), moving the bonding unit 130 to position the bonding unit 130 at the bonding position (S515), and bonding the chip 42 at the bonding position on the substrate 20 (S520). According to the embodiment of the present disclosure, the moving of the bonding unit 130 (S515) may include acquiring the first temperature value from the first temperature sensor installed on the bonding unit 130, acquiring the second temperature value from the second temperature sensor installed at the periphery of the bonding apparatus, and determining the movement distance of the bonding unit 130 based on the weighted sum of the first temperature value and the second temperature value.

In the embodiment, the bonding method may further include correcting the first weight applied to the first temperature value and correcting the second weight applied to the second temperature value based on the result of the bonding inspection on the chip 42 on the substrate 20.

In the embodiment, the moving of the bonding unit 130 (S515) may further include acquiring the third temperature value corresponding to the temperature of the first movement guide 141 from the first temperature sensor installed on the first movement guide 141 that defines the route for the horizontal movement of the bonding unit 130 on the gantries 136 and 138.

In the embodiment, the moving of the bonding unit 130 (S515) may further include determining the movement distance of the bonding unit 130 based on the weighted sum of the first temperature value, the second temperature value, and the third temperature value.

In the embodiment, the moving of the bonding unit 130 (S515) may further include acquiring the fourth temperature value corresponding to the temperature of the second movement guide 142 from the first temperature sensor installed on the second movement guide 142 that defines the route for the horizontal movement of the bonding unit 130 on the gantries 136 and 138.

In the embodiment, the moving of the bonding unit 130 may further include determining the movement distance of the bonding unit 130 based on the weighted sum of the first temperature value, the second temperature value, the third temperature value, and the fourth temperature value.

In the embodiment, the bonding method may further include correcting the first weight, the second weight, the third weight, and the fourth weight applied to the fourth temperature value based on the result of the bonding inspection on the chip 42 on the substrate 20.

While the embodiments of the present disclosure have been described, the detailed description of the present disclosure described with reference to the drawings is just an example of the present disclosure. The description has been used for the purpose of explaining the present disclosure, but not used to limit the meaning or the scope of the present disclosure disclosed in the claims. Therefore, those skilled in the art will understand that various modifications of the embodiment and any other embodiment equivalent thereto are available. Accordingly, the true technical protection scope of the present disclosure should be determined by the technical spirit of the appended claims.

What is claimed is:

1. A bonding apparatus comprising:
   a stage on which a substrate is seated, wherein the stage is configured to move in a first horizontal direction;

a gantry installed above the stage and extending in a second horizontal direction perpendicular to the first horizontal direction;
a bonding unit configured to bond a chip to the substrate while moving in the second horizontal direction along the gantry;
a first temperature sensor installed on the bonding unit and configured to provide a first temperature value corresponding to a temperature of the bonding unit;
a second temperature sensor installed at a periphery of the bonding apparatus and configured to provide a second temperature value corresponding to a temperature of air at the periphery of the bonding apparatus; and
a control device configured to:
cause the bonding unit to be aligned with a bonding position of the substrate,
control the bonding unit to allow the bonding unit to bond the chip at the bonding position of the substrate, and
determine a horizontal movement distance of the bonding unit in the second horizontal direction based on a weighted sum of the first temperature value and the second temperature value.

2. The bonding apparatus of claim 1,
wherein the control device is configured to correct a first weight applied to the first temperature value and correct a second weight applied to the second temperature value based on a result of a bonding inspection on the chip bonded to the substrate.

3. The bonding apparatus of claim 2,
wherein the gantry comprises a first movement guide and a second movement guide that define a route for a horizontal movement of the bonding unit, and
wherein each of the first movement guide and the second movement guide extends in the second horizontal direction.

4. The bonding apparatus of claim 3, further comprising:
a third temperature sensor installed on the first movement guide and configured to provide a third temperature value corresponding to a temperature of the first movement guide,
wherein the control device is configured to determine the movement distance of the bonding unit based on a weighted sum of the first temperature value, the second temperature value, and the third temperature value.

5. The bonding apparatus of claim 4,
wherein the control device is configured to correct the first weight, the second weight, and a third weight applied to the third temperature value based on the result of the bonding inspection on the chip bonded to the substrate.

6. The bonding apparatus of claim 5, further comprising:
a fourth temperature sensor installed on the second movement guide and configured to provide a fourth temperature value corresponding to a temperature of the second movement guide,
wherein the control device is configured to determine the movement distance of the bonding unit based on a weighted sum of the first temperature value, the second temperature value, the third temperature value, and the fourth temperature value.

7. The bonding apparatus of claim 6,
wherein the control device is configured to correct the first weight, the second weight, the third weight, and a fourth weight applied to the fourth temperature value based on the result of the bonding inspection on the chip bonded to the substrate.

8. A bonding apparatus comprising:
a loading part on which a container for accommodating a substrate is seated;
a substrate conveying part configured to convey the substrate from the container seated on the loading part;
a bonding part configured to bond a chip to the substrate provided from the substrate conveying part; and
an inspection part configured to receive, from the substrate conveying part, the substrate processed by the bonding part and inspect the chip bonded to the substrate,
wherein the bonding part comprises:
a stage on which the substrate is seated, wherein the stage is configured to move in a first horizontal direction;
a gantry installed above the stage and extending in a second horizontal direction perpendicular to the first horizontal direction;
a bonding unit configured to bond the chip to the substrate while moving in the second horizontal direction along the gantry;
a first temperature sensor installed on the bonding unit and configured to provide a first temperature value corresponding to a temperature of the bonding unit;
a second temperature sensor installed in the vicinity of the bonding part and configured to provide a second temperature value corresponding to a temperature of air in the vicinity of the bonding part; and
a control device configured to:
cause the bonding unit to be aligned with a bonding position of the substrate,
control the bonding unit to allow the bonding unit to bond the chip at the bonding position of the substrate, and
determine a horizontal movement distance of the bonding unit in the second horizontal direction based on a weighted sum of the first temperature value and the second temperature value.

9. The bonding apparatus of claim 8,
wherein the control device is configured to correct a first weight applied to the first temperature value and corrects a second weight applied to the second temperature value based on a result of a bonding inspection, by the inspection part, on the chip bonded to the substrate.

10. The bonding apparatus of claim 9,
wherein the gantry comprises a first movement guide and a second movement guide that define a route for a horizontal movement of the bonding unit.

11. The bonding apparatus of claim 10, further comprising:
a third temperature sensor installed on the first movement guide and configured to provide a third temperature value corresponding to a temperature of the first movement guide,
wherein the control device is configured to determine the movement distance of the bonding unit based on a weighted sum of the first temperature value, the second temperature value, and the third temperature value.

12. The bonding apparatus of claim 11,
wherein the control device is configured to correct the first weight, the second weight, and a third weight applied to the third temperature value based on the result of the bonding inspection on the chip bonded to the substrate.

13. The bonding apparatus of claim 10, further comprising:
a third temperature sensor installed on the first movement guide and configured to provide a third temperature value corresponding to a temperature of the first movement guide; and a fourth temperature sensor installed on the second movement guide and configured to provide a fourth temperature value corresponding to a temperature of the second movement guide, wherein the control device is configured to:

determine the movement distance of the bonding unit based on a weighted sum of the first temperature value, the second temperature value, the third temperature value, and the fourth temperature value, and correct the first weight, the second weight, a third weight applied to the third temperature value, and a fourth weight applied to the fourth temperature value based on the result of the bonding inspection on the chip bonded to the substrate.

\* \* \* \* \*